United States Patent
Altknecht et al.

(10) Patent No.: US 8,657,352 B2
(45) Date of Patent: Feb. 25, 2014

(54) ROBOTIC DEVICE FOR SUBSTRATE TRANSFER APPLICATIONS

(75) Inventors: David J. Altknecht, San Jose, CA (US); Robert E. Erickson, San Jose, CA (US); Christopher O. Lada, Los Gatos, CA (US); Stuart Stephen Papworth Parkin, San Jose, CA (US); Mahesh Samant, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 290 days.

(21) Appl. No.: 13/084,435

(22) Filed: Apr. 11, 2011

(65) Prior Publication Data

US 2012/0256435 A1    Oct. 11, 2012

(51) Int. Cl.
*H01L 21/68*    (2006.01)
*H01L 21/677*    (2006.01)

(52) U.S. Cl.
USPC ........... 294/213; 294/103.1; 414/941; 901/31

(58) Field of Classification Search
USPC ............... 294/213, 106, 111, 103.1; 414/941, 414/737; 901/32, 36, 39, 30, 31; 623/24, 623/57, 64; 74/490.04
See application file for complete search history.

(56) References Cited

U.S. PATENT DOCUMENTS

| | | | |
|---|---|---|---|
| 5,160,877 A | 11/1992 | Fujiwara et al. | |
| H0001378 H | 11/1994 | Crane et al. | |
| 5,366,340 A | 11/1994 | Vo et al. | |
| 5,727,832 A | 3/1998 | Holter | |
| 6,290,275 B1 | 9/2001 | Braam et al. | |
| 6,354,791 B1 | 3/2002 | Wytman et al. | |
| 6,386,609 B1 | 5/2002 | Govzman | |
| 6,500,737 B1 * | 12/2002 | Yoo | 438/502 |
| 6,513,848 B1 | 2/2003 | Shendon et al. | |
| 6,623,235 B2 * | 9/2003 | Yokota et al. | 294/99.1 |
| 6,682,113 B2 | 1/2004 | Cox et al. | |
| 6,685,422 B2 | 2/2004 | Sundar et al. | |
| 6,692,049 B2 | 2/2004 | Holbrooks | |
| 7,048,316 B1 | 5/2006 | Blank et al. | |
| 7,140,655 B2 * | 11/2006 | Kesil et al. | 294/104 |
| 7,233,842 B2 | 6/2007 | Bacchi et al. | |
| 7,281,741 B2 | 10/2007 | Woodruff et al. | |
| 7,374,386 B2 | 5/2008 | Talmer | |
| 7,625,027 B2 | 12/2009 | Kiaie et al. | |
| 7,857,569 B2 | 12/2010 | Hiroki et al. | |
| 2006/0261702 A1 | 11/2006 | Harada et al. | |

FOREIGN PATENT DOCUMENTS

GB    2171978 A    9/1986

* cited by examiner

*Primary Examiner* — Paul T Chin
(74) *Attorney, Agent, or Firm* — Daniel E. Johnson (57) ABSTRACT

A device for use in the semiconductor industry includes a robotic arm whose end effector includes at least two prongs designed to hold a substrate carrier. A pushing member located between the prongs can move independently of the prongs and is configured to exert force against the substrate carrier while the prongs are retracted from the substrate carrier, after the substrate carrier has been brought to its intended position. In this manner, the position of the substrate carrier is maintained at its intended position as the prongs are retracted. Each of the prongs may include a claw or gripping member for grasping the substrate carrier.

20 Claims, 7 Drawing Sheets

FIG. 4B

ROBOTIC DEVICE FOR SUBSTRATE TRANSFER APPLICATIONS

TECHNICAL FIELD

The invention relates to a robotic device, and more particularly, to an end effector suitable for transferring substrate carriers, such as those used in the semiconductor industry.

BACKGROUND

A universal aspect of automated semiconductor processing systems (including advanced research deposition and analysis systems) is some form of transfer mechanism for moving substrates into, through, and out of process/deposition/analysis chambers. Since these systems are expensive, a reasonable return on investment necessitates high system through-put, which can be achieved only if the transfer mechanism is reliable. However, the demands of most processes create challenges to maintaining reliability of the transfer mechanism. These demands can include high or low temperatures, vacuum, corrosive gases, special material requirements, motion control requirements, special sensing requirements, or a combination of the foregoing.

Transfer mechanisms, or robots, are generally designed to do a simple task, such as pick up a substrate carrier, move it, and place it in a desired location. Such simple actions are difficult in a vacuum—not just because of the obvious constraints of working in a vacuum, but also because of the significant effect that vacuum has on the tribological properties of materials. Unfortunately, the designs for robots to be used in vacuum are often derived from those designed for use in air, so that the reliability of robots in vacuum can degrade quickly. To mitigate reliability problems, several measures can be undertaken, such as avoiding contact or sliding between parts made of similar materials, using hard or wear-resistant coatings where contact does occur, and restricting movement to motions that are precise and carefully controlled to avoid collisions. Nevertheless, robotic devices having improved reliability and flexibility are desired.

SUMMARY

This invention addresses one of the challenges associated with a robot placing its load at an intended position. In semiconductor processing equipment, an intended position can be a receiving mechanism, a platen, a chuck in a process chamber, or a slot in a cassette. In prior art devices, as the robot withdraws its end effector after releasing its load, any slight contact with the load can dislodge that load from its intended position. In this invention, the robot employs a mechanism, called a pusher, to ensure that the deposited load (e.g., the carrier and its substrate) remains in its intended position while the end effector is withdrawn.

One aspect of the invention is a device that includes a robotic arm that has an end effector. The end effector includes i) at least two prongs designed to hold a substrate carrier and ii) a pushing member that can move independently of the prongs. The pushing member is configured to exert force against the substrate carrier while the prongs are retracted from the substrate carrier, thereby preventing the substrate carrier from being retracted while the prongs are retracted. The device further includes one or more motors for moving the pushing member and the prongs.

A preferred method for use with this device includes the following steps:

(a) bringing, by using the end effector, a selected substrate carrier to a desired position, the prongs holding the selected carrier while the selected carrier is being moved;

(b) moving the pushing member towards the selected carrier, the pushing member exerting force against the selected carrier;

(c) moving the prongs away from the selected carrier, while the pushing member continues to exert force against the selected carrier and thereby maintain the desired position of the selected carrier; and (d) retracting the pushing member so that it no longer contacts the selected carrier, in which steps (a), (b), (c), and (d) are carried out in turn (in that order). The method can be carried out under harsh conditions, e.g., at elevated temperatures, under vacuum, and/or in an oxidizing atmosphere such as that used in a deposition or etching process.

Another aspect of the invention is a device that includes i) a forked member having ends that engage and hold a substrate carrier and ii) a pusher that extends between the ends of the forked member, so that the pusher can apply force against the substrate carrier as the forked member is retracted from the substrate carrier.

Yet another aspect of the invention is a device that includes i) a plurality of extension members, the extension members having respective gripping members designed to hold a substrate carrier and ii) a pushing member between two of the extension members. The pushing member can be moved independently of each of the plurality of extension members; it is used for maintaining the position of a substrate carrier that has been brought to a desired position by exerting force against the positioned carrier when the extension members are retracted.

BRIEF DESCRIPTION OF THE DRAWINGS

FIG. 2, which includes FIGS. 2A, 2B, and 2C, shows various views of a portion of a robotic device (that portion being designated herein as the "fork assembly") and its end effector, including prongs for holding and moving a substrate carrier and a pusher for keeping the substrate carrier in place, in which.

FIG. 4, which includes

DETAILED DESCRIPTION

Figure 1:
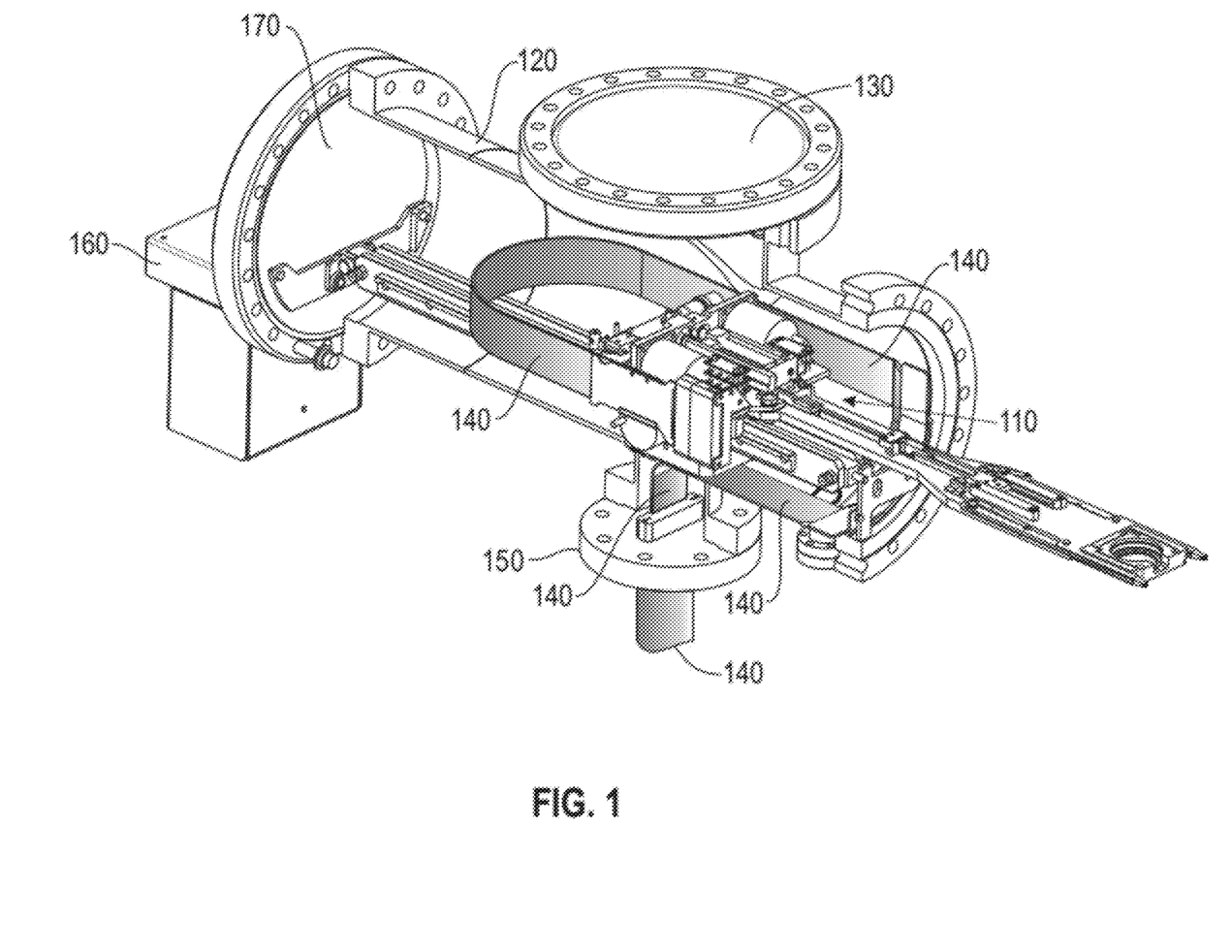
FIG. 1 illustrates an embodiment of the invention housed within a robot chamber, which in turn is connected to one or more other chambers used for semiconductor processing.

A preferred embodiment of the invention is now described with respect to the figures. FIG. 1 shows a robotic device 110 mounted within a robot chamber 120 (shown as a cutaway for clarity). The robot chamber 120 includes a viewing port 130 that includes transparent glass through which the robotic device 110 can be viewed. The robotic device 110 can be moved through the robot chamber 120 towards an adjacent load lock chamber or cassette loading chamber (not shown, but the load lock chamber would be connected to, and to the right of, the robot chamber 120 in FIG. 1), where a substrate carrier can be loaded or removed from the robotic device 110. The load lock chamber is in turn connected to a process chamber (not shown, but still further to the right), such as a deposition chamber or an etching chamber, where materials may be deposited onto a substrate or wafer positioned by the robotic device 110. Electrical power is supplied to the robotic device 110 through a ribbon cable 140 that passes through an electrical feedthrough 150. More precisely, the portion of the ribbon cable 140 that is external to the robot chamber 120 mates with electrical pins (not shown) in the electrical feedthrough 150, and the portion of the ribbon cable 140 within the robot chamber 120 likewise mates with the electrical pins, so that no mechanical feedthrough is used that might otherwise compromise the integrity of the vacuum. Alternatively, the cable 140 external to the robot chamber 120 need not be a ribbon cable. To the left of the robot chamber 120 is a distance sensing laser assembly 160. A laser beam (not shown) directed through the glass of a second viewing port 170 can be used to establish the approximate position of the robotic device 110.

Figure 2A:
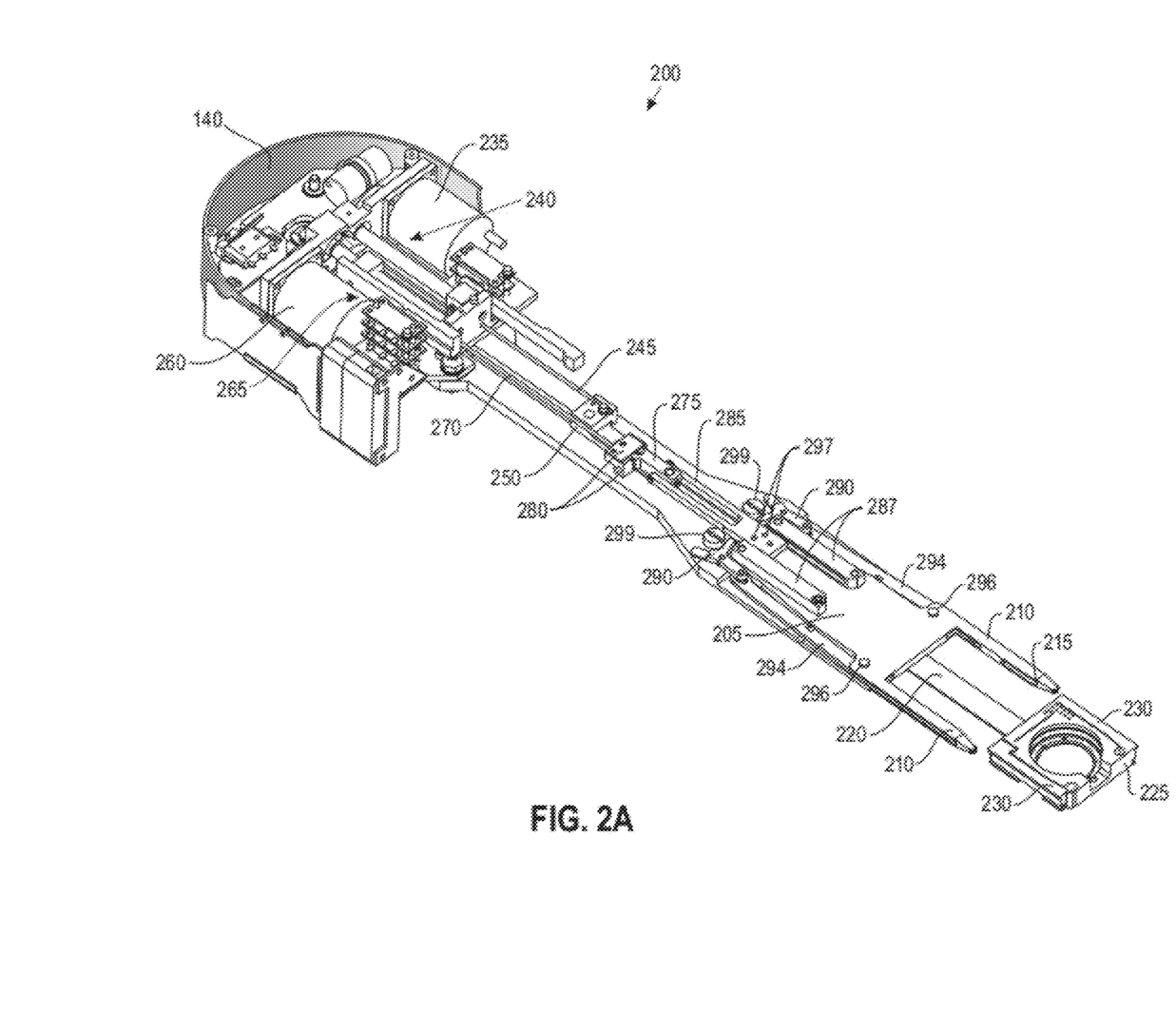
FIG. 2A is a perspective view of the fork assembly.
Figure 2B:
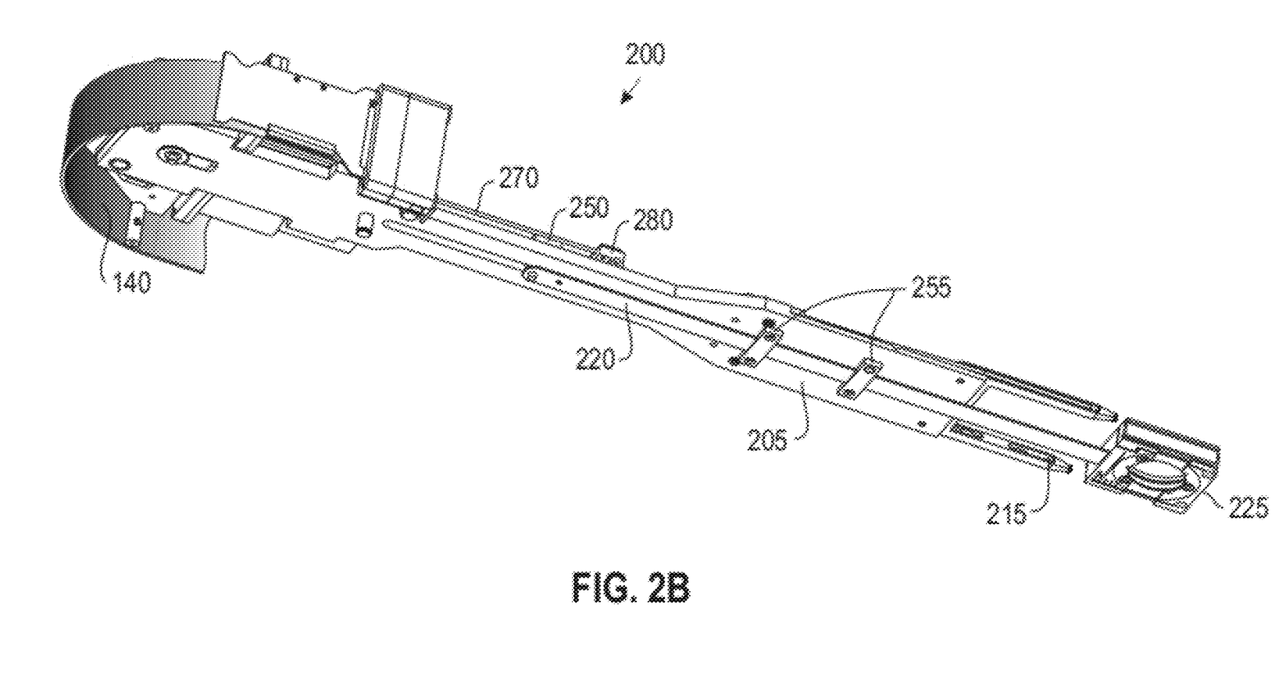
FIG. 2B is a view of the underside of the fork assembly.
Figure 3:
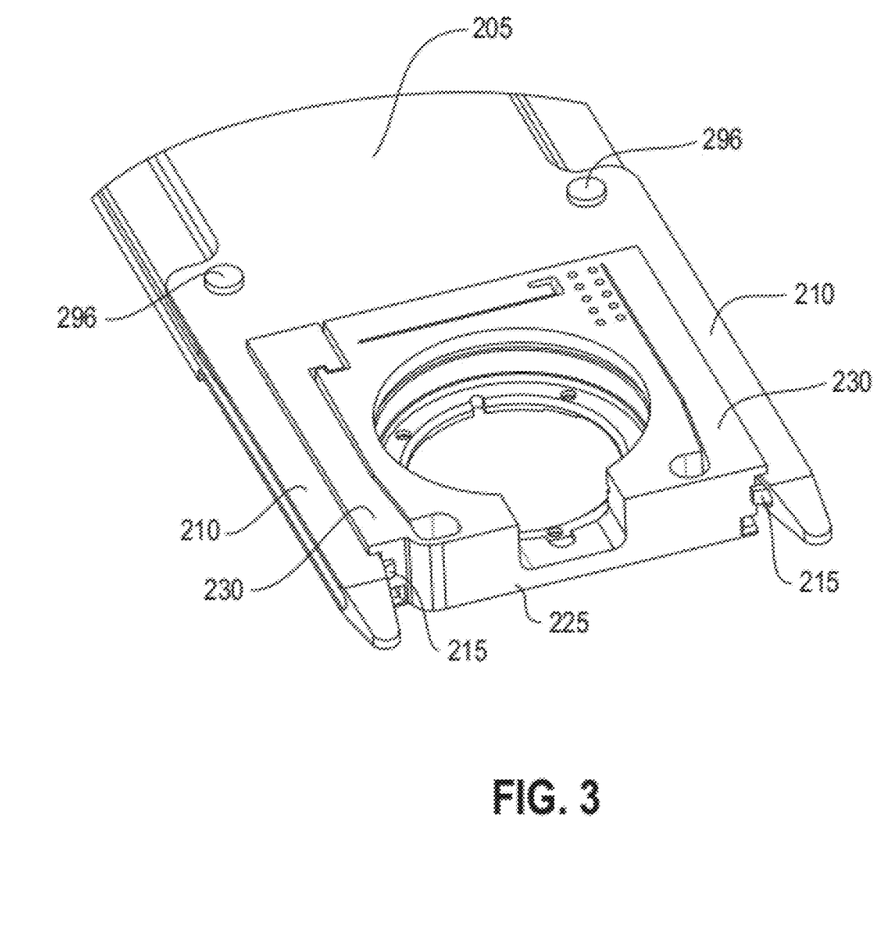
FIG. 3 shows a substrate carrier at the distal end of the end effector.

FIGS. 2A and 2B show in greater detail that portion of the robotic device 110 designated as the fork assembly 200, which includes a fork 205 with its two prongs 210 that house respective motor-actuated claws 215. The fork assembly 200 also includes a pusher 220. The end effector portion of the robotic device 110 can be used to manipulate a substrate carrier 225. The claws 215 are retracted in FIGS. 2A and 2B, but as is evident from FIG. 3, when the claws are extended they can be used to grasp and restrain the substrate carrier 225 so that it can be moved securely from one location to another. (A substrate can be placed in the center, hollow portion of the substrate carrier 225 and then overlaid with a block of SiC, which can be heated with infrared radiation to heat the underlying substrate; neither the substrate nor the SiC block is shown in FIG. 3.)

Once the substrate carrier 225 has been brought to an intended position, it is released by bringing the claws 215 to their retracted position (see FIGS. 2A and 2B, in which the claws are retracted). The prongs 210 are then pulled back from the substrate carrier 225; note that the prongs slide underneath flange portions 230 of the substrate carrier as they are retracted from the substrate carrier. Unfortunately, even slight contact between mechanical parts under vacuum can generate high frictional forces. Thus, one could imagine that as the prongs 210 are withdrawn, the substrate carrier 225 might be unintentionally dragged along as a result of accidental contact with the prongs, thereby dislodging the substrate carrier from its intended position.

To circumvent this problem, when the claws 215 release the substrate carrier 225, the pusher 220 moves towards the substrate carrier until contact occurs (or alternatively, the pusher may be brought into contact with the substrate carrier before or after the claws release the substrate carrier). The pusher 220 is used to apply force against the substrate carrier 225 while the prongs 210 are retracted, as shown in FIGS. 2A and 2B; doing so keeps the substrate carrier 225 in place (e.g., at a desired location in a process chamber or in a cassette in a load lock chamber).

Actuation of the pusher 220 is now described with respect to FIGS. 2A and 2B. A pusher motor 235 is mechanically tied to various components designated collectively as the pusher drive mechanism 240. The pusher drive mechanism 240 may include conventional components, such as one or more gears, lead screws, traveling nuts, and limit switches for constraining motion. The pusher drive mechanism 240 engages a pusher drive rod 245, thereby pushing this rod either forwards or backwards relative to the fork 205. The pusher drive rod 245 is in turn fixed to a pusher guide block 250, which in turn is connected to the pusher 220 (see FIG. 2B, which shows the underside of the fork assembly 200). As the pusher guide block 250 is moved forwards or backwards within a groove in the fork 205, the pusher 220 is likewise moved forwards or backwards. In this manner, the pusher 220 can be made to butt up against the substrate carrier 225 or retracted from it. Two pusher guide brackets 255 help keep the pusher 220 in place as it is moved back and forth.

Figure 2C:
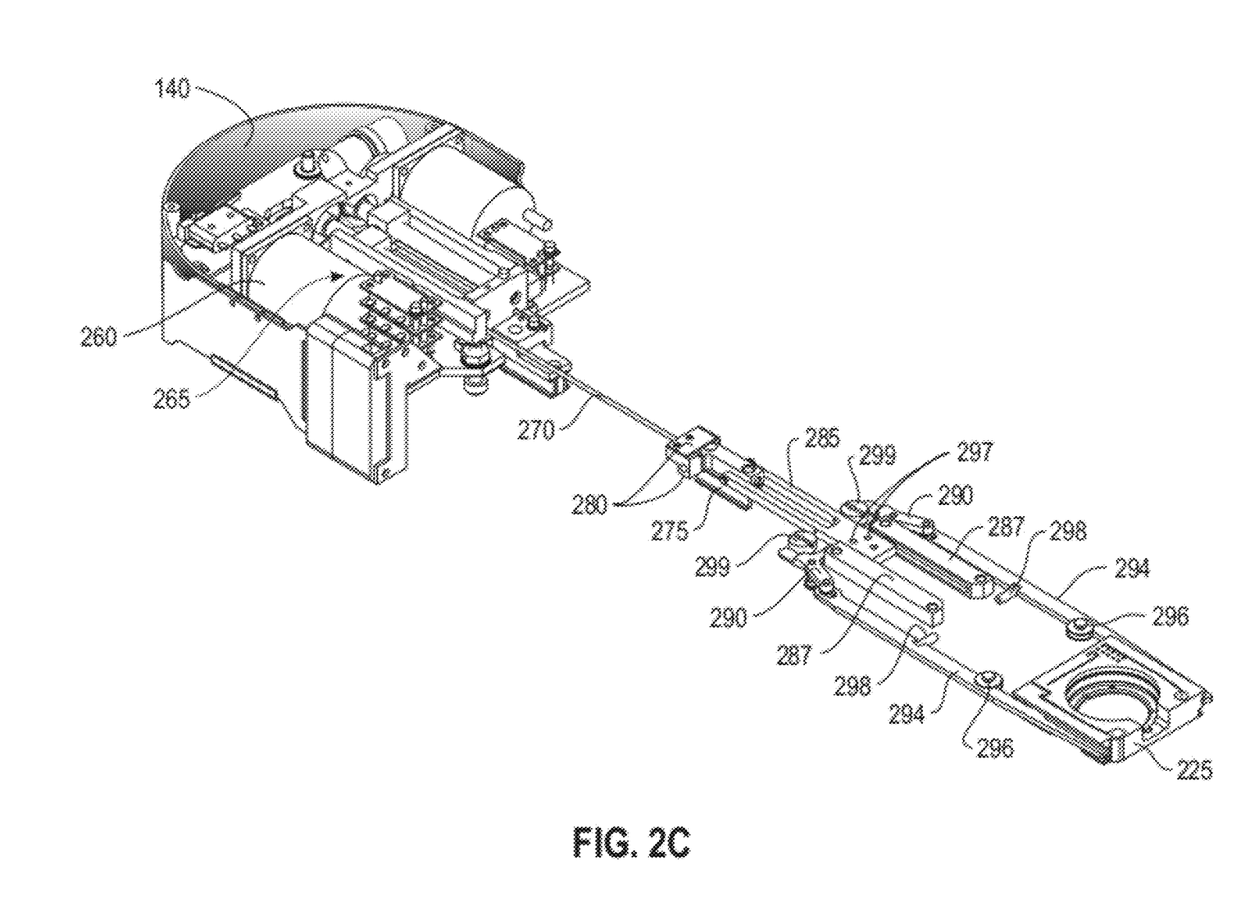
FIG. 2C is a perspective view of the fork assembly with certain components related to the pusher removed from view, to better illustrate how the prongs and their claws function.

Actuation of the claws 215 is now described with respect to FIGS. 2A and 2C. In FIG. 2C components related to operation of the claws 215 are visible, whereas for clarity certain components unique to operation of the pusher 220 have been removed from view. A claw motor 260 is mechanically tied to various components designated collectively as the claw drive mechanism 265. The claw drive mechanism 265 may include conventional components, such as one or more gears, lead screws, traveling nuts, and limit switches for constraining motion. The claw drive mechanism 265 engages a claw drive rod 270, thereby pushing this rod either forwards or backwards relative to the fork 205. The claw drive rod 270 is in turn fixed to a claw guide block 275, which is secured by two clamps 280. The claw guide block 275 is in turn secured to a beam 285, whose motion is constrained by guide members 287 located on both sides of the beam.

When the beam 285 moves forwards, two links 290 rotate to allow the proximal ends of levers 294 to move in an outward direction, so that the claws 215 at the distal ends of the levers are deployed from out of their respective prongs 210 (as the levers rotate about respective pivots 296), thereby permitting the claws 215 to grasp a carrier 225. Specifically, two springs 298 acting between the fork 205 (not shown in FIG. 2C) and respective levers 294 urge the two rotating links 290 (each having 3 arms) to maintain contact with pins 297 that are attached to the beam 285 and extend below the beam. (Each spring 298 fits within a notch in a respective lever 294 and a hole in the fork 205).

Conversely, the claws 215 are retracted when the claw drive rod 270 is moved backward. Specifically, as the beam 285 is retracted, the pins 297 contact the rotating links 290, causing them to rotate. This in turn causes the levers 294 to rotate inward, which compresses the springs 298. Note that the rotating links 290 are constrained in one direction by respective adjustable stops 299, so that the claws 215 do not extend too far inward when they are deployed; motion of the rotating links 290 is constrained in the other direction by a sensor in the claw drive mechanism 265, so that the claws 215 do not rotate out of the prongs 210 when they are retracted.

Figure 4A:
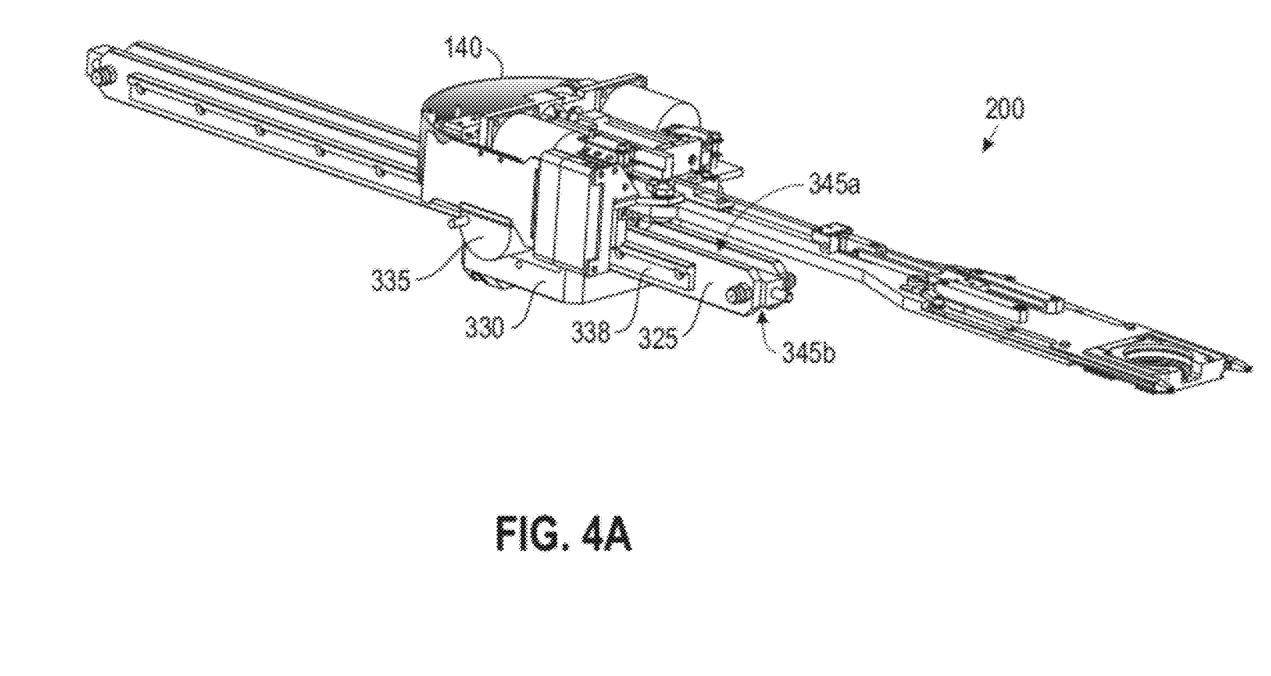
FIGS. 4A and 4B, illustrates views of the robotic device and its relationship to a rail along which it travels.
Figure 4B:
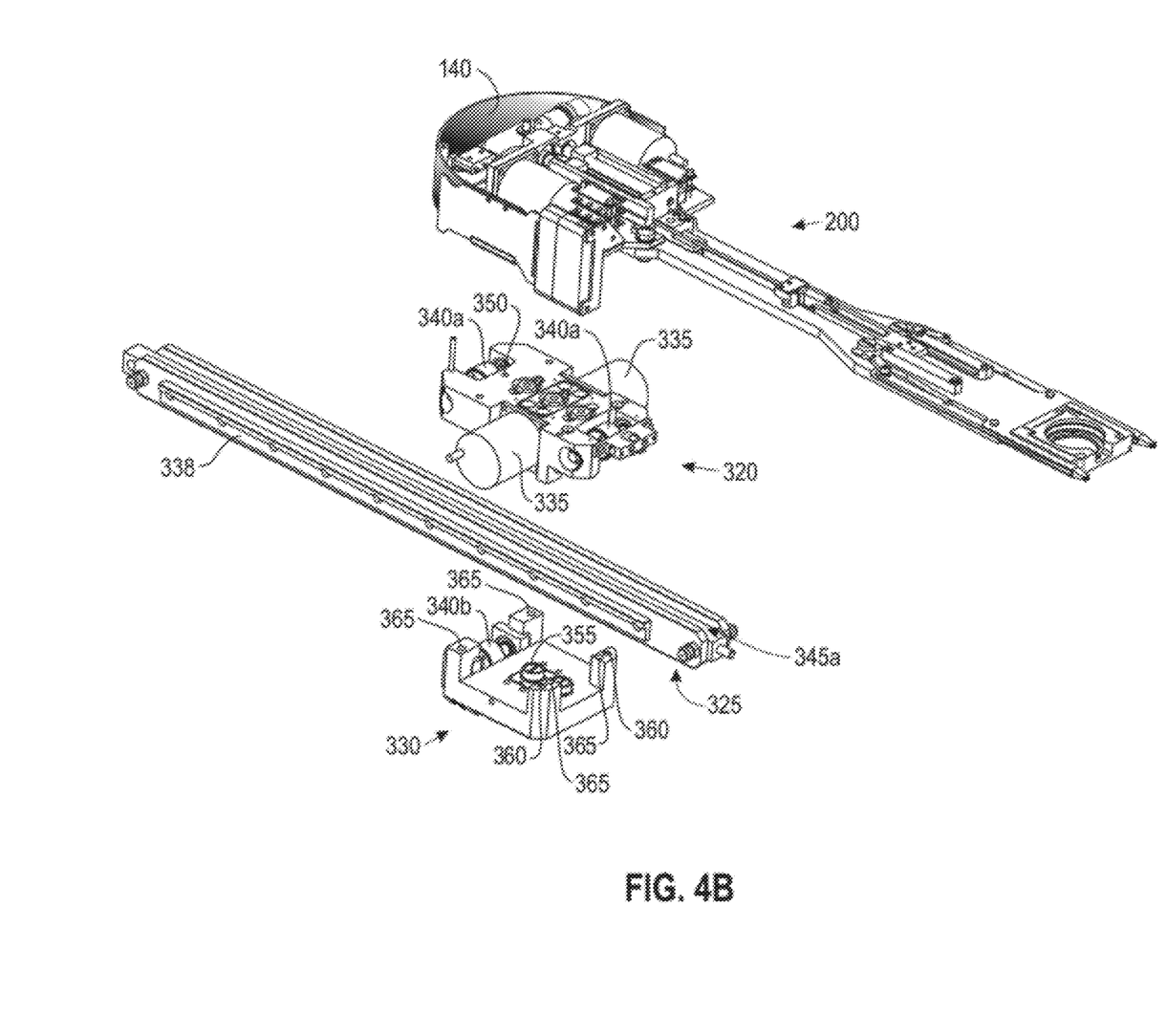

Movement of the fork assembly 200 is now described with respect to FIGS. 4A and 4B. FIG. 4A shows the fork assembly 200 in combination with other components designed to permit the fork assembly to move back and forth throughout the robot chamber 120 (see also FIG. 1). An exploded view of the same is shown in FIG. 4B, which shows the fork assembly 200, an upper carriage block 320, a rail 325, and a lower carriage block 330. When these components are assembled, the fork assembly 200 can move along and over the rail 325.

The upper carriage block 320 includes two drive motors 335, which when run together provide the torque necessary to drive the upper carriage block, the lower carriage block 330, and the fork assembly 200 along a gear rack 338 of the rail 325. The upper carriage block 320 includes two translational rollers 340$a$ that run within a groove 345$a$ in the rail 325. A pin (not shown) extends between a pinhole 350 in the upper carriage block 320 and the fork assembly 200, thereby holding together the upper carriage block and the fork assembly.

The lower carriage block 330 includes a translational roller 340b and centering rollers 355, all of which run along a groove 345b within the underside of the rail 325. Pins and screws that fit within pin holes 360 and screw holes 365, respectively, permit the lower carriage block 330 to be fixed precisely to the upper carriage block 320.

As mentioned previously, once the substrate carrier 225 has been brought to an intended location, the pusher 220 is used to apply force against the substrate carrier while the prongs 210 are retracted. Otherwise, the substrate carrier 225 might be unintentionally dislodged from its intended location (e.g., within a cassette in a load lock chamber or a deposition chamber). Preferably, the pusher 220 is in contact with the substrate carrier 225 for the entire time that the prongs 210 are being retracted. One way to accomplish this is to synchronize the motion of the fork assembly 200 (with its prongs 210) and the motion of the pusher 220, so that the distal end of the pusher extends away from the end effector (located at the distal end of the fork assembly) at the same speed that the end effector is retracted from the substrate carrier 225. To this end, the actions of the pusher motor 235 and the drive motors 335 may be coordinated using a motion controller (not shown) to control the respective movements of the pusher motor and drive motors, so that the fork assembly 200 retreats along the rail 325 at the same speed that the pusher 220 moves forward relative to the fork assembly. That is, the net effect is that the pusher 220 does not move with respect to the rail 325 (which is generally fixed) or the substrate carrier 225 (which is to be kept stationary at an intended location). Alternatively, the drive motors 335 may simply be turned off, and the pusher 220 (driven by the pusher motor 235) may push against the substrate carrier 225, so that the fork assembly 200 and its prongs 210 (along with the upper carriage block 320 and the lower carriage block 330) are pushed away from the substrate carrier.

The various parts of the robotic device 110 may be machined from stock materials. The fork 205 may be advantageously made of molybdenum, since it is thermally and mechanically stable. Alternatively, the fork 205 could be made from a ceramic material such as Macor® (although ceramics are more brittle), or the fork could be made out of more compliant materials, such as plastic (e.g., polyimide), if the substrate carrier were made of a relatively soft material. Other parts in the fork assembly 200, such as the claws 215 and the pusher 220, can be made of stainless steel, for example. The substrate carrier 225 is preferably fabricated from HAYNES® 230® alloy, which is designed to withstand oxidation (e.g., from oxygen or air) even at high temperatures (e.g., at 100° C., 150° C., 200° C., or greater), which are conditions encountered by the robotic device 110 described herein. At such high temperatures and under vacuum, oil-based lubricants are not recommended; rather, solid lubricants such as $MoS_2$ or $WS_2$ (e.g., Dicronite® coating) may be applied to parts such as gear surfaces to reduce friction.

The dimensions of the various parts disclosed herein may be selected in view of the intended application. A robotic device 110 designed for use in a research environment (e.g., for transferring small wafers having a diameter of 20-30 mm) would be smaller than one designed for use in a manufacturing setting (e.g., for transferring wafers having a diameter of 300 mm). A smaller, research-oriented device may have, for example: prongs 210 having a length between 20 and 60-100 mm and a width between 6 and 12 mm; a fork assembly 200 whose range of motion is between 200 mm and 600 mm; a substrate carrier having a width and a length of 40-60 mm; and claws 215 whose hooked portion (the portion that contacts the substrate carrier) has a length of 1-3 mm. A larger device designed for manufacturing applications may have, for example: prongs 210 having a length between 300 and 350 mm and a width between 25 and 40 mm; a fork assembly 200 whose range of motion is between 600 mm and 1000 mm; a substrate carrier having a width and a length of 300-350 mm; and claws 215 whose hooked portion (the portion that contacts the substrate carrier) has a length of 2-6 mm. In either case, the range of motion of the pusher 220 is preferably comparable to that of the length of the prongs 210.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

The invention claimed is:

1. A method for use with a device that comprises (i) a robotic arm that includes an end effector, the end effector including at least two prongs designed to hold a substrate carrier and also including a pushing member that can move independently of said at least two prongs, wherein the pushing member is configured to exert force against the substrate carrier while said at least two prongs are retracted from the substrate carrier, thereby preventing the substrate carrier from being retracted while said at least two prongs are retracted and (ii) at least one motor for moving the pushing member and said at least two prongs, the method comprising:

(a) bringing, by using the end effector, a selected substrate carrier to a desired position, the prongs holding the selected carrier while the selected carrier is being moved;

(b) moving the pushing member towards the selected carrier, the pushing member exerting force against the selected carrier;

(c) moving the prongs away from the selected carrier, while the pushing member continues to exert force against the selected carrier and thereby maintain the desired position of the selected carrier; and (d) retracting the pushing member so that it no longer contacts the selected carrier, wherein said steps (a), (b), (c), and (d) are carried out in turn.

2. The method of claim 1, wherein the prongs include respective claws that are used to grasp the selected carrier, and wherein prior to step (c), the method includes releasing the selected carrier from the claws.

3. The method of claim 2, wherein the selected carrier is in a vacuum as steps (a)-(d) are carried out.

4. The method of claim 1, wherein the selected carrier is in a vacuum as steps (a)-(d) are carried out.

5. The method of claim 1, wherein the selected carrier is exposed to a temperature greater than 100° C. as steps (a)-(d) are carried out.

6. The method of claim 1, wherein the selected carrier is exposed to a temperature greater than 200° C. as steps (a)-(d) are carried out.

7. The method of claim 1, wherein the selected carrier is exposed to an oxidizing environment used in a deposition or etching process.

8. The method of claim 1, wherein the end effector includes only two prongs.

9. The method of claim 8, wherein the prongs are separated from each other by less than 400 mm.

10. The method of claim 8, wherein the prongs are separated from each other by less than 60 mm.

11. A method for use with a device having (i) a forked member having ends that engage and hold a substrate carrier and (ii) a pusher that extends between the ends of the forked member, so that the pusher can apply force against the substrate carrier as the forked member is retracted from the substrate carrier, the method comprising:
   (a) bringing, by using the forked member, a selected substrate carrier to a desired position, the ends holding the selected carrier while the selected carrier is being moved;
   (b) moving the pusher towards the selected carrier, the pusher exerting force against the selected carrier;
   (c) moving the ends away from the selected carrier, while the pusher continues to exert force against the selected carrier and thereby maintain the desired position of the selected carrier; and
   (d) retracting the pusher so that it no longer contacts the selected carrier, wherein said steps (a), (b), (c), and (d) are carried out in turn.

12. The method of claim 11, wherein the ends of the forked member include two prongs, the pusher extending between the prongs, so that a distal end of the pusher can contact the substrate carrier as the prongs are retracted.

13. The method of claim 12, wherein each of the prongs includes a claw member for grasping the substrate carrier.

14. The method of claim 13, wherein the forked member includes only two prongs.

15. The method of claim 14, wherein the prongs are separated from each other by less than 400 mm.

16. The method of claim 14, wherein the prongs are separated from each other by less than 60 mm.

17. A method for use with a device that includes (i) a plurality of extension members, the extension members having respective gripping members designed to hold a substrate carrier and (ii) a pushing member between two of the extension members, wherein the pushing member can be moved independently of each of said plurality of extension members, the pushing member maintaining the position of a substrate carrier that has been brought to a desired position by exerting force against the positioned carrier when the extension members are retracted, the method comprising:
   (a) bringing, by using the extension members, a selected substrate carrier to a desired position, the gripping members holding the selected carrier while the selected carrier is being moved;
   (b) moving the pushing member towards the selected carrier, the pushing member exerting force against the selected carrier;
   (c) moving the extension members away from the selected carrier, while the pushing member continues to exert force against the selected carrier and thereby maintain the desired position of the selected carrier; and
   (d) retracting the pushing member so that it no longer contacts the selected carrier, wherein said steps (a), (b), (c), and (d) are carried out in turn.

18. The method of claim 17, wherein the pushing member exerts force against the positioned carrier when the gripping members release the positioned carrier.

19. The method of claim 17, wherein the selected carrier is exposed to a temperature greater than 200° C. as steps (a)-(d) are carried out.

20. The method of claim 17, wherein the selected carrier is exposed to an oxidizing environment used in a deposition or etching process.

* * * * *